United States Patent [19]
Whiteley

[11] Patent Number: 4,812,689
[45] Date of Patent: Mar. 14, 1989

[54] INCREMENTAL TIME DELAY GENERATOR

[75] Inventor: Steve Whiteley, Shrub Oak, N.Y.

[73] Assignee: Hypres, Inc., Elmsford, N.Y.

[21] Appl. No.: 90,377

[22] Filed: Aug. 28, 1987

[51] Int. Cl.$^4$ .................... H03K 5/13; H03K 5/153
[52] U.S. Cl. ................................ 307/605; 307/227;
307/306; 357/5
[58] Field of Search .............. 307/227, 306, 592, 601,
307/605; 357/5; 365/162

[56] References Cited

U.S. PATENT DOCUMENTS

| | | | |
|---|---|---|---|
| 3,383,526 | 5/1968 | Berding | 307/227 |
| 4,533,840 | 8/1985 | Gheewala et al. | 307/352 |
| 4,584,494 | 4/1986 | Arakawa et al. | 307/227 |

OTHER PUBLICATIONS

"Electronically Adjustable Delay for Josephon Technology", Richard E. Harris et al, Electron Device Letters, vol. EDL-3, No. 9, Sep. 1982, pp. 261-263.

Primary Examiner—John Zazworsky
Attorney, Agent, or Firm—Kenyon & Kenyon

[57] ABSTRACT

An incremental time delay generator may be disposed on a small substrate and may be used in conjunction with a time domain reflectometer. The incremental time delay generator produces an output signal at a variable time delay in response to a trigger signal and it may include a first superconducting device for generating a first pulse signal in response to the trigger signal, a transmission line configuration or a multiple inductive tap device for converting the pulse signal into a step signal wherein a time interval T is defined as the time between successive steps of the step signal; and a second superconducting device that is responsive to the step signal and produces a second pulse signal when the step signal exceeds a predetermined threshold. The time delay generated by the generator is equal to nT when the step signal exceeds the predetermined threshold in the (n+1)th step of the step signal.

14 Claims, 4 Drawing Sheets

INCREMENTAL TIME DELAY GENERATOR

CROSS-REFERENCED APPLICATIONS

The present invention is related to:

(a) U.S. patent application Ser. No. 912,785 entitled "Time Domain Reflectometer" filed on Sept. 26, 1986.

(b) U.S. patent application Ser. No. 796,841 entitled "Cryogenic Electrical Interface" filed on Nov. 12, 1985; and (c) U.S. patent application Ser. No. 796,842 entitled "Open Cycle Cooling of Electrical Circuits" filed on Nov. 12, 1985.

BACKGROUND OF THE INVENTION

1. Technical Field

The present invention relates to an incremental time delay generator. Such a generator can be used in a time domain reflectometer. In particular, the present invention relates to an incremental time delay generator which can be disposed on a small substrate and which utilizes superconductor technology.

2. Description of the Related Art

The use of superconductor technology in the form of superconducting devices, and in particular Josephson tunneling devices, in sampling or analog to digital (A/D) circuits is already known in the art. Use of a Josephson device provides a very sensitive detector offering the possibility of very fast sampling speeds because such a device is capable of extremely fast switching speed between two stable states and because the device responds to extremely small magnetic fields. U.S. Pat. No. 4,401,900 "Ultra High Reduction Josephson Sampling Technique" by Faris, shows a Josephson sampling technique with a time resolution of 5 picoseconds and a sensitivity of 10 microvolts. The time resolution of the described sampling system is extendable to the subpicosecond domain, limited ultimately by the intrinsic switching speed of the Josephson device used as the sampling gate. In principle, the switching speed can be as little as 0.09 picoseconds.

Related U.S. application Ser. No. 912,785, "Time Domain Reflectometer" discloses the use of Josephson junction technology to accurately measure discontinuities of network connections and to determine parameters of certain networks and devices. Time domain reflectometers comprise sampling circuitry including a step or pulse source. The related application discloses a time domain reflectometer which increases the switching speed of the reflectometer system and integrates on a single integrated circuit chip, a step generator, sampling circuitry, filter elements and ultra high performance transmission lines. This integrated chip achieves minimum jitter during the operation of the TDR system since all of the circuitry, which has reduced jitter already due to Josephson junction technology, is subject to the same random disturbances which may occur.

A problem still arises in that a time delay generator is needed for the reflectometer. A timing delay must be generated between producing a step signal and introducing a sampling pulse in the time domain reflectometer of the related application. One solution is to provide an external source of delay. An internal source of delay may be utilized where the internal source of delay may include a capacitor bank. Neither of these two solutions to the problem of providing a time delay generator provide a variable incremental time delay generator which is easily variable and integrated with the chip that constitutes the time domain reflectometer. The delay range available is limited and the generation of the time delay is subject to jitter.

SUMMARY OF THE INVENTION

It is therefore an object of the present invention to provide an incremental time delay generator which has available a wide delay range that is subject to low jitter.

It is a further object of the present invention to provide an incremental time delay generator for a time domain reflectometer, the incremental time delay generator being disposed on a small substrate with the time domain reflectometer.

It is still a further object of the present invention to provide an incremental time delay generator using superconductor technology.

It is yet a further object of the present invention to provide an incremental time delay generator on a small substrate utilizing Josephson junction technology.

It is still yet a further object of the present invention to provide an incremental time delay generator which produces a time delayed output signal where the time delay for producing the signal is variable in accordance with adjustments to biasing currents of Josephson junction devices utilized in the delay generator and, where the variations in the time delay are composed of fixed increments of time.

The above and further objects of the present invention are achieved by an incremental time delay generator disposed on a substrate for producing an output signal at a variable time delay in response to a trigger signal, comprising:

(a) means for generating a first signal in response to the trigger signal;

(b) means for converting said first signal into an intermediate value having an instantaneous value that varies at each of one or more fixed time intervals; and (c) means responsive to said intermediate signal for producing said output signal at a time delay determined by when said instantaneous value of said intermediate signal exceeds a predetermined threshold.

In the incremental time delay generator, the means for generating the first signal and the means responsive to the intermediate signal may comprise a first Josephson junction device and a second Josephson junction device respectively. The means for converting of the incremental time delay generator may comprise a transmission line that receives the first signal at a first end of the line and is terminated at a second end so as to produce a reflection of a signal that enters the transmission line at the first end. The means for converting may alternatively comprise a primary superconducting strip line for passing signals therethrough, having a first end that receives the first signal and a second end terminated so as to produce a reflection of a signal that enters the first end, said primary superconducting strip line having a plurality of inductive taps and a secondary superconducting strip line inductively coupled with the plurality of inductive taps, the secondary superconducting strip line producing the intermediate signal in accordance with signals passing through the primary superconducting strip line.

BRIEF DESCRIPTION OF THE DRAWINGS

The present invention will be described in greater detail below in the following detailed description with reference being made to the drawings in which.

DESCRIPTION OF THE PREFERRED EMBODIMENTS

Figure 1:
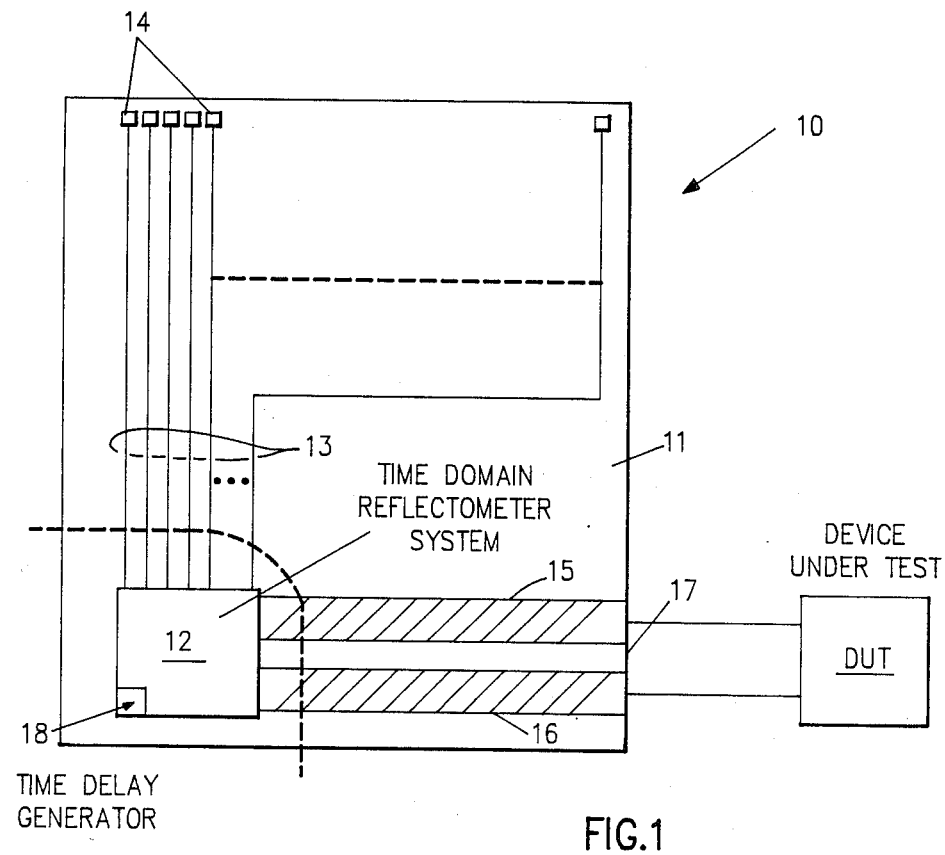
FIG. 1 is a schematic representation of the layout-architecture of an integrated circuit chip having formed thereon a time domain reflectometer including the incremental time delay generator of the present invention.

It is to be noted that like elements are designated with like reference numerals throughout the drawings.

Figure 2A:
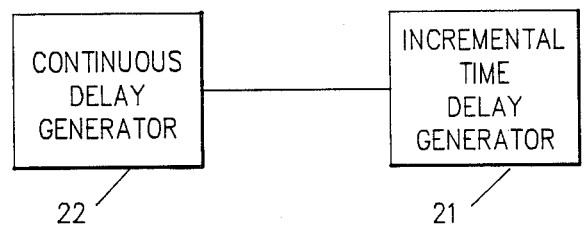
FIG. 2(a) is a block diagram of a time delay generator of FIG. 1.
Figure 2B:
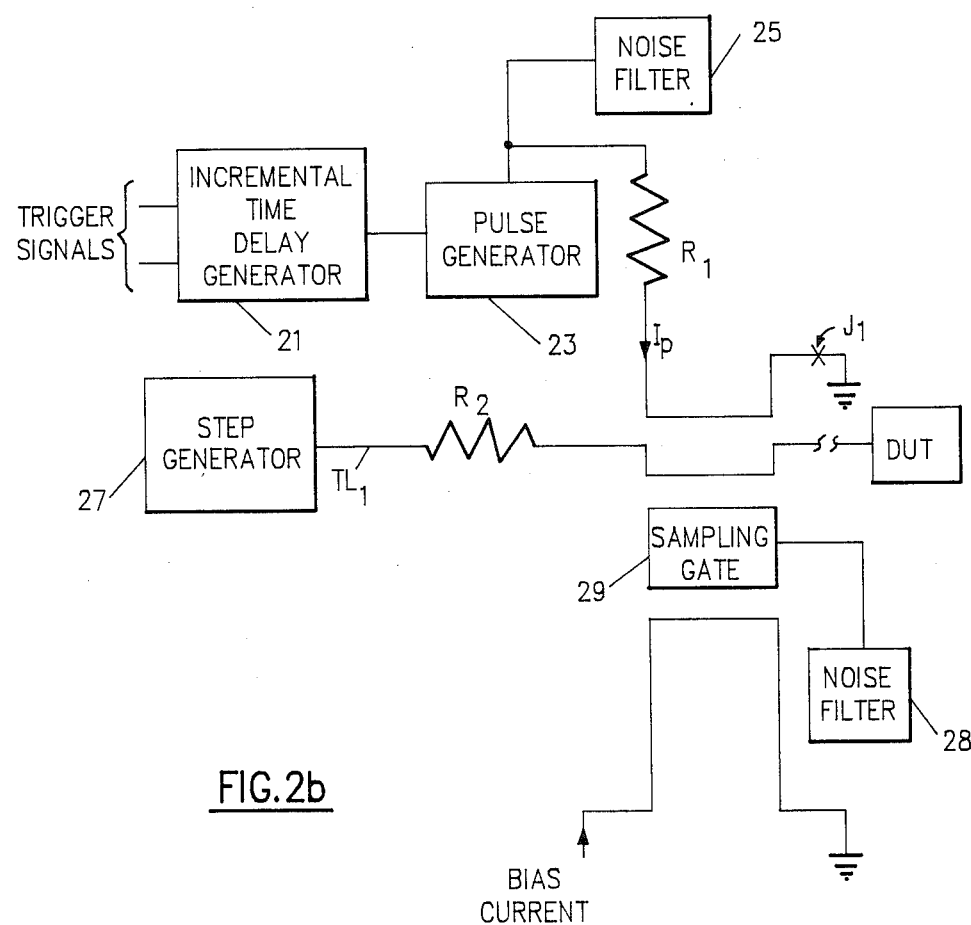
FIG. 2(b) is an electrical schematic diagram of the time domain reflectometer of FIG. 1 including the incremental delay generator of the present invention.

FIGS. 1, 2(a) and 2(b) illustrate the use of the incremental time delay generator of the present invention in a time domain reflectometer.

FIG. 1 shows the layout/architecture of an integrated circuit chip 10 that has formed thereon a time domain reflectometer system including the incremental time delay generator of the present invention. The chip 10 comprises an elongated substrate 11 whose material and physical dimensions are dependent upon the particular application of the chip. Fabricated at one corner of the substrate 11 by a known method is a time domain reflectometer system 12 which utilizes Josephson junction circuitry. The time domain reflectometer system 12 includes a time delay generator 18 that includes the incremental time delay generator of the present invention. The area of the substrate 11 on which the TDR system 12 lies as indicated by the dashed line in FIG. 1, is cooled to cryogenic temperatures according to the apparatus and method of the copending applications U.S. patent applications Ser. Nos. 796,841 or 796,842. The remaining substrate area 11 is at room temperature. A number of non-critical biasing and monitoring lines 13, which may be of niobium or gold are connected to the TDR system 12 and extend most of the length of the substrate 11 to a group of connection or bonding pads 14 which act as a low frequency interface for bonding to room temperature circuitry off of the chip 10. High performance transmission lines 15 and 16, which also may be of niobium or gold, extend from the TDR system 12 to a high frequency interface 17 at the other end of the substrate 11. The high frequency interface 17 is connected to a device under test (DUT) whose waveforms are to be sampled and measured. The physical constraints that the high performance transmission lines 15 and 16 must satisfy in order to maintain the necessary performance for sampling and measuring are described in the copending U.S. patent application Ser. No. 796,841.

FIG. 2(a) is a block diagram of the time delay generator 18 of FIG. 1. The time delay generator 20 may consist of a series connection of a continuous delay generator 22 and an incremental time delay generator of the present invention 21.

FIG. 2(b) is an electrical schematic diagram of a TDR system 12 including the incremental time delay generator of the present invention. The TDR system 12 is connected to a device under test (DUT) whose output signal waveform, $I_x(t)$ is to be sampled and measured. The TDR system 12 comprises a sampling gate 29 which has connected thereto a noise filter circuit 28 and magnetically coupled thereto an adjustable bias current circuit, a portion of which may be off of the chip 10. The sampling gate 29 utilizes superconducting devices, such as a Josephson tunneling device to perform sampling of waveforms. Such a superconducting sampling gate is well known in the art, for example, as described in U.S. Pat. No. 4,401,900.

The TDR system 12 also comprises a pulse generator gate 23 which is magnetically coupled to the sampling gate via a $R_1$-$J_1$ (resistor-Josephson junction device) series, and provides a sampling pulse $I_p$ to the sampling gate 29 via this magnetic coupling. The pulse generator gate is also tied to a noise filter circuit 25. A pulse generator gate which uses superconducting circuitry is also well known in the art, for example, as described in U.S. Pat. No. 4,401,900.

An incremental time delay generator 21 is connected to the pulse generator gate 23. The incremental time delay generator receives trigger signals and in response to the trigger signals generates a time delay for the production of a pulse signal by the pulse generator gate 23.

The TDR system 12 further comprises a step generator which is connected via chip transmission line $TL_1$, having a resistive termination R2, and the high performance transmission lines 15 and 16 (not shown), to the device under test (DUT). The chip transmission line $TL_1$ is magnetically-coupled to the sampling gate 29 and the pulse generator gate 23. The step generator outputs a voltage step signal, $I_s$ on the chip transmission line $TL_1$ with a fast rise time, e.g., less than 10 picoseconds, which is necessary in a high performance electrical system such as a time domain reflectometer. Similar systems include logic circuitry drivers and differentiating pulse generators.

In operation the step generator produces an output step signal, $I_s$ to the device under test (DUT). In response to the output step signal $I_s$ the DUT outputs a signal waveform $I_x(t)$ which is transmitted back along the chip transmission line TL1. The pulse generator gate and the associated Josephson junction device J1 produce a sampling pulse, $I_p$ which is applied to the sampling gate 29 via the magnetic coupling therebetween. The sampling gate 29 is a threshold device which will change its state when the summation of the inputs thereto exceeds a threshold value. The sampling gate 29 thus sums the sampling pulse, $I_p$ from the pulse generator gate 23, the output waveform $I_x(t)$ and a bias current signal, $I_b$ from the bias current circuit in order to change its voltage state when this sum exceeds the threshold value. Since the threshold value is generally set at a constant amplitude, the value of the bias current signal, $I_b$ will track the amplitude of the output signal waveform, $I_x(t)$ if the amplitude of the sampling pulse $I_p$ is held constant. The time delay between the generation of the step signal, $I_s$ and the introduction of the sampling pulse $I_p$, that which sweeps across the step signal and the resulting output signal $I_x(t)$, is influenced by the incremental time delay generator 21. The delay is the sum of the delay produced by the continuous time delay generator 22 of FIG. 2(a) and the delay produced by the incremental delay generator 21. The continuous time delay generator is subject to increased jitter if it is not operated in a limited range. By coupling the continuous time delay generator, with a limited range of operation, with the incremental time delay generator, the available time range is increased without an increase in jitter.

Figure 3:
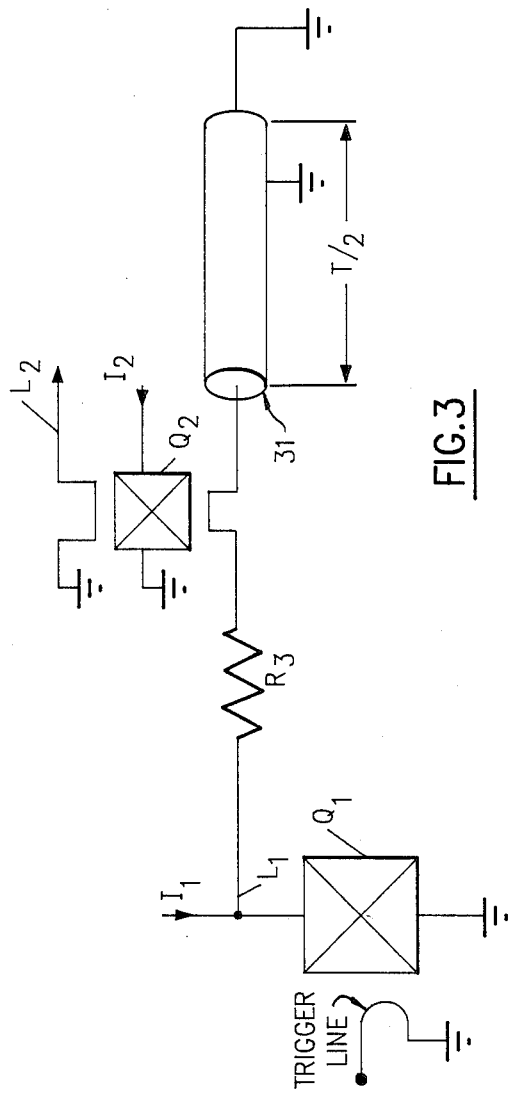
FIG. 3 is an electrical schematic diagram illustrating a first embodiment of the incremental time delay generator of the present invention.

A first embodiment of the incremental time delay generator of the present invention is illustrated in FIG. 3. A first superconducting device Q1 has a switching threshold current value $I_{Q1}$ which is determined by a bias current $I_1$ applied to the device. The first superconducting device Q1 is magnetically coupled to the Trigger Line so as to receive trigger signals. The first superconducting device Q1 is connected by line $L_1$ through resistance R3 to a transmission line 31. Between resistance R3 and transmission line 31, line $L_1$ is magnetically coupled to a second superconducting device Q2 having its own switching threshold current value $I_{Q2}$ which is set by a bias current $I_2$. The second superconducting device is magnetically coupled to line $L_2$ which is connected to the pulse generator gate 23 of FIG. 2(b).

In operation, the bias current $I_1$ sets the switching threshold current value $I_{Q1}$ at which the first superconducting device will be caused to switch voltage states. When a trigger signal appears on the Trigger Line, the switching threshold current value is exceeded and the first superconducting device Q1 will switch voltage states from a substantially zero voltage state to a substantially non-zero voltage state. This will cause a pulse signal to be generated and transmitted through line $L_1$. The pulse signal will pass through line $L_1$ to a first end of transmission line 31. The transmission line is properly terminated at a second end so as to provide a reflection of any signal entering the transmission line at the first end, including the pulse signal produced by the first superconducting device. Multiple reflections are possible due to the construction of the circuit of FIG. 3. The pulse signal is first reflected at the second end of the transmission line 31. Then, this reflected signal travels along the transmission line 31 to Line $L_1$, and toward superconducting device $Q_1$ which is an effective short circuit to ground once the trigger signal disappears A second reflection occurs at this termination. A signal passing through line $L_1$ and transmission line 31 will be reflected at either termination point. A signal is produced on line $L_1$ which has a step-like or staircase like form. Such a signal is illustrated in FIG. 7.

Figure 7:
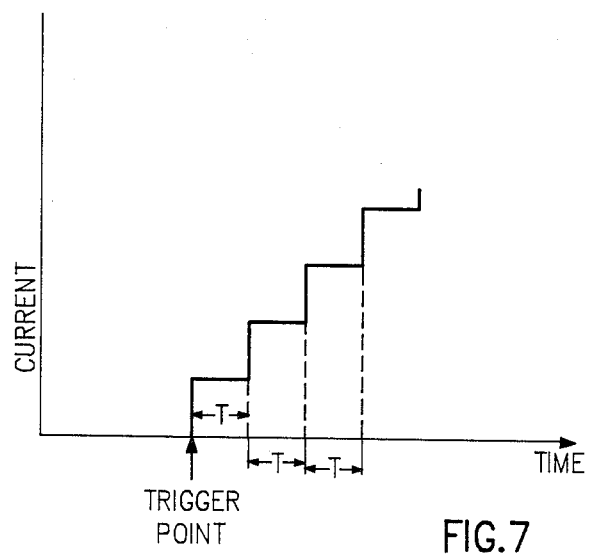
FIG. 7 is a graph representative of a signal produced in both the first and second embodiments of the present invention as illustrated in FIGS. 3 and 4 respectively.

In FIG. 7 it is clear that there is no signal on line $L_1$ until a trigger point at which the first superconducting device Q1 switches voltage states. Subsequent in time to the trigger point, the value of the signal on line $L_1$ increases in a stepwise fashion whereby the time interval between steps is T. Time interval T corresponds to the time necessary to travel from a first end to a second end of the transmission line 31 and back again. The time necessary to travel from one end of the transmission line to the other is T/2.

Bias current $I_2$ sets the threshold $I_{Q2}$ at which superconducting device Q2 will switch from a substantially zero voltage state to a substantially nonzero voltage state. Since the second superconducting device is magnetically coupled to line $L_1$, it is influenced by the signal which appears on line $L_1$.

The signal on line $L_1$ continues to increase in a stepwise fashion. As it increases, it eventually reaches a value at which the switching threshold current value $I_{Q2}$ of the second superconducting device Q2, set by bias current $I_2$, is exceeded. When the switching threshold current value $I_{Q2}$ is exceeded, the voltage state of the second superconducting device Q2 changes from a substantially zero voltage state to a substantially non-zero voltage state. The resultant change in voltage state produces a signal on line $L_2$ which acts as a trigger to the pulse generator gate 23 of FIG. 2(b) so as to produce the necessary pulse signal $I_p$ in the time domain reflectometer 12 of FIG. 2(b).

Figure 4:
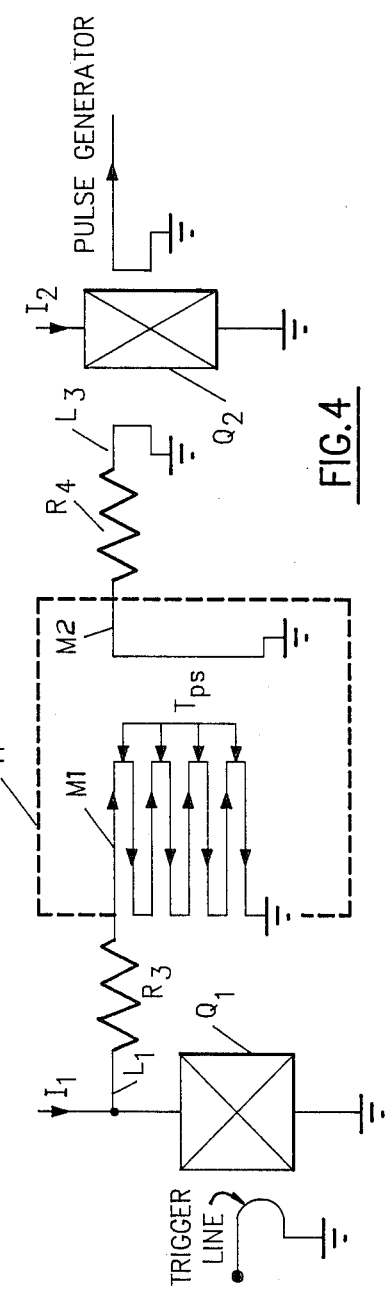
FIG. 4 is an electrical schematic diagram of a second preferred embodiment of the incremental time delay generator of the present invention.

FIG. 4 illustrates a second embodiment of the incremental time delay generator of the present invention. The second embodiment is somewhat similar to the first embodiment illustrated in FIG. 3 except that a multiple inductive tap device 41 replaces transmission line 31 as a means for converting a pulse signal produced by first superconducting device Q1 in response to a trigger signal, into a step-like waveform which will trigger the changing of voltage states of second superconducting device Q2. In FIG. 4, the first superconducting device Q1 receives bias current $I_1$ which sets a switching threshold current $I_{Q1}$. The first superconducting device $Q_1$ is connected to $L_1$. Line $L_1$ connects the first superconducting device $Q_1$, through resistance $R_3$ to a multiple inductive tap device 41. The multiple inductive tap device 41, is connected through resistance R4 to line $L_3$. Line $L_3$ is magnetically coupled to the second superconducting device Q2 whose switching threshold current value $I_{Q2}$ for switching voltage states is set by bias current $I_2$. The second superconducting device is magnetically coupled to line $L_2$ which is connected to the pulse generator 23 of FIG. 2.

Figure 5:
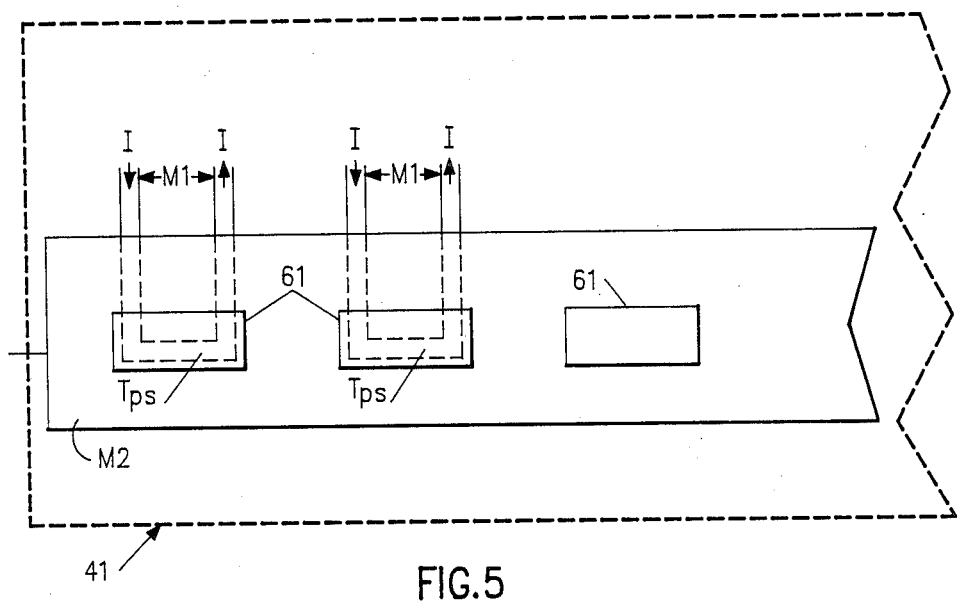
FIG. 5 is a schematic diagram of a top view of a multiple inductive tap device of FIG. 4.

In operation, a trigger signal is received at a Trigger Line and the switching threshold current value $I_{Q1}$ is exceeded. This causes the first superconducting device Q1 to change voltage states from a substantially zero voltage state to a substantially nonzero voltage state, thereby producing a pulse signal on line $L_1$. The pulse signal traverses line $L_1$ entering into the multiple inductive tap device 41. The multiple inductive tap device is composed of superconducting strip lines having a first superconducting strip line M1 with a unique construction, the pulse signal entering the multiple inductive tap device at a first end of the first superconducting strip line M1. The first superconducting strip line M1 has a plurality of segments of equal length where alternate segments carry the pulse signal generated by the first superconducting device Q1 toward taps Tps while the remaining segments carry the pulse signal generated by first superconducting device Q1 away from taps Tps as indicated by the arrows appearing on the segments as illustrated in FIG. 5. A second superconducting strip line M2 is magnetically coupled to the inductive taps Tps. As the pulse signal appears at each Tps when it traverses the first superconducting strip line segments, it adds to the current signal at the second superconducting device. Therefore, when the pulse signal passes each inductive tap Tps, a step signal is produced at the second superconducting strip line M2.

The step-like signal is similar to the signal produced by the circuit arrangement of FIG. 3 and illustrated in FIG. 7. However, the step-like signal is produced in a different manner. The step signal is produced by the summation at the second superconducting strip line M2 of the pulse signal produced by the first superconducting device Q1 as it traverses the segments of the first superconducting strip line M1.

The delay time or time interval between "steps" of the signal appearing at the second superconducting strip line M2 depends upon the length of the segments of the first superconducting strip line M1. The first superconducting strip line segments can be constructed so as to produce a time interval T selected from a range of 50 picoseconds to 1 nanosecond. This is a dramatic improvement over the time interval capabilities of the first embodiment illustrated in FIG. 3.

This second embodiment, illustrated in FIG. 4, provides a step-like signal which has more steps with less reflections. This is important because the terminations which cause reflections will generally not be perfect and the signal will tend to degrade with each reflection. Thus, in the second embodiment, the reduction in reflections results in a reduced likelihood of signal degradation and therefore an enhanced signal. In addition, the second embodiment produces a signal having a faster rise time than the first embodiment illustrated in FIG. 3.

Figure 6:
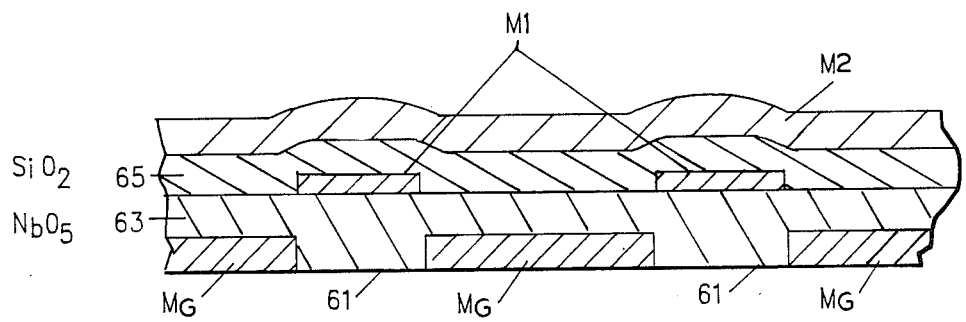
FIG. 6 is a cross-sectional view of a portion of the multiple inductive tap device of FIG. 5.

FIGS. 5 and 6 illustrate a construction of the multiple inductive tap device 41 of FIG. 4.

FIG. 5 illustrates a schematic top view of the multiple inductive tap device 41 of FIG. 4. The first superconducting strip line M1 receives the pulse signal produced by the first superconducting device Q1 in response to a trigger signal. The signal traverses the strip line M1 as signal I in the direction indicated by the arrows on the first superconducting strip line M1 in FIG. 5. The second superconducting strip line M2 is disposed above the inductive taps Tps of the first superconducting strip line M1 with an insulating layer disposed therebetween (not shown). As the pulse passes through each successive one of the taps Tps, the second superconducting strip line M2 sums the pulses to produce a signal similar to that illustrated in FIG. 7.

It is to be noted that the time interval between steps in the signal produced by the second embodiment of the present invention, illustrated in FIG. 4, can in fact be much smaller than that for the transmission line system of FIG. 3 because of the use of multiple inductive taps comprising superconducting materials. The steps are produced with fewer signal reflections thereby enhancing the operation of the time delay generator. It is to be noted that a second end of the first superconducting strip line M1 is terminated so as to provide a reflection point for the pulse signal produced by the first superconducting device Q1 that traverses the length of the entire first superconducting strip line M1. The pulse is reflected back along the first superconducting strip line M1 in a direction opposite to the arrows shown in FIG. 5 and results in further additions to the signal produced at the second superconducting strip line M2. Continued reflections will be produced either at the second end of the first superconducting strip line M1 or at the first end of the superconducting strip line M1 which is grounded through the first superconducting device Q1 which is an effective short circuit when the trigger signal is absent. Therefore, the stepwise signal will continue to increase so as to exceed the switching threshold current value $I_{Q2}$ set for the second superconducting device Q2 by bias current $I_2$.

FIG. 6 illustrates a side view of the multiple inductive tap device illustrated in FIGS. 4 and 5. A ground plane $M_G$ is provided with holes 61. Disposed above the ground plane $M_G$ and the holes 61 is a first insulating film 63 which may comprise niobium-oxide. A first superconducting strip line M1 is disposed on the first insulator layer 63 above the holes 61 in ground plane $M_G$. A second insulating layer 65 is disposed over the exposed portions of the first insulating layer 63 and the first superconducting strip line. The second insulating layer may comprise $SiO_2$. A second superconducting strip line M2 is then disposed over the second insulating layer 65 in such a manner so as to be disposed over portions of the first superconducting strip line M1 thereby creating an inductive coupling therebetween.

In the present invention both the first superconducting device Q1 and the second superconducting device Q2 may comprise Josephson junction devices that switch from a zero-voltage state to a non-zero voltage state when they receive a signal which exceeds a threshold determined by a bias current applied to the Josephson junction device.

In operation, the first superconducting device Q1 operates as a means for generating a first signal in response to a trigger signal. A means for converting the first signal into an intermediate signal which has a step-like shape is also provided where the means for converting may comprise a transmission line or a multiple inductive tap device. Finally, the second superconducting device operates as a means that is responsive to the intermediate signal produced by the means for converting and produces an output signal at a time delay from the receipt of the trigger signal by the generator, where the time delay is determined by the time at which the instantaneous value of the intermediate signal exceeds a threshold value of the second superconducting device.

In the present invention the means for converting a signal produced by a first superconducting device converts the signal into a step signal having a time interval T between successive steps of the signal. The time delay between receipt of the trigger signal by the first superconducting device and production of an output signal is equal to n×T when the stepwise signal exceeds a predetermined threshold of the second superconducting device in the $n+1^{th}$ step of the step signal.

It is important to note that the length of the intervals of the steps is fixed by the construct of the device. In the first embodiment of the present invention illustrated in FIG. 3, the length of each interval is fixed by the amount of time necessary for a signal to traverse the length of transmission line 31. In the second embodiment of the present invention, illustrated in FIG. 4, the interval is fixed in accordance with the amount of time necessary to traverse a segment of the multiple inductive tap device. Therefore, the interval between steps in the intermediate signal that is produced by either the transmission line or the multiple inductive tap device is fixed. However, the threshold at which the second superconducting device Q2 will change voltage states can be varied by adjusting the bias current $I_2$ applied thereto. The time delay between the receipt of the trigger signal by the incremental time delay generator and the production of an output signal by the second superconducting device Q2 is therefore variable, the amount of delay varying as the bias current $I_2$ is adjusted and varying in fixed intervals of time, the length of which are determined by the physical characteristics of the means for converting a signal produced by the first superconducting device Q1 into a step-wise signal.

In both the first and second embodiments of the present invention the step-like waveform increases by a fixed value at the end of each fixed interval. The fixed value increase is determined by the amplitude of the pulse signal produced by the first superconducting device Q1 in response to the trigger signals.

In the present invention an incremental time delay generator can be disposed on a small substrate and can produce a time delay which can be varied by fixed increments, thereby providing time delays necessary for the operation of time domain reflectometers or other devices which might make use of the capability of generating an incremental time delay with a single chip device. In the present invention the incremental time delay generator may utilize superconducting devices which can be Josephson junction devices in order to produce pulse signals in response to trigger signals and step signals however the present invention is not limited to this construction. Other fast switching devices might also be used in their stead.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What I claim is:

1. An incremental time delay generator disposed on a substrate for producing an output signal at a variable time delay in response to a trigger signal, comprising:
    means for generating a first signal in response to said trigger signal wherein said means for generating comprises a first Josephson junction device that switches from a zero voltage state to a non-zero voltage state when said trigger signal is received;
    means for converting said first signal into an intermediate signal having an instantaneous value that varies at each of one or more fixed time intervals; and
    means responsive to said intermediate signal for producing said output signal at a time delay determined by when said instantaneous value of said intermediate signal exceeds a predetermined threshold wherein said means responsive to said intermediate signal comprises a second Josephson junction device that switches from a zero voltage state to a non-zero voltage state when said instantaneous value of said intermediate signal exceeds said predetermined threshold.

2. The generator of claim 1 wherein said means for converting comprises a transmission line having a first end that receives said first signal and a second end that is terminated so as to produce a reflection of a signal that enters said transmission line at said first end.

3. An incremental time delay generator disposed on a substrate for producing an output signal at a variable time delay in response to a trigger signal, comprising:
    means for generating a first signal in response to said trigger signal;
    means for converting said first signal into an intermediate signal having an instantaneous value that varies at each of one or more fixed time intervals, wherein said means for converting comprises:
      a first superconducting strip line for passing signals therethrough, having a first end that receives said first signal and a second end terminated so as to produce a reflection of a signal that enters said first end, said first superconducting strip line being arranged so as to have a plurality of inductive taps; and
      a second superconducting strip line inductively coupled with said plurality of inductive taps, said second superconducting strip line producing said intermediate signal in response to said signals passing through said first superconducting strip line; and
    means responsive to said intermediate signal for producing said output signal at a time delay determined by when said instantaneous value of said intermediate signal exceeds a predetermined threshold.

4. An incremental time delay generator in a Time Domain Reflectometer for producing an output signals at a variable time delay in response to as trigger signal comprising:
    means for generating a first signal in response to said trigger signal wherein said means for generating comprises a first Josephson junction device that switches from a zero voltage state to a non-zero voltage state upon receiving said trigger signal;
    means for converting said first signal into an intermediate signal having an instantaneous value that varies at each of one or more fixed time intervals; and
    means responsive to said intermediate signal for producing said output signal at a time delay determined by when said instantaneous value of said intermediate signal exceeds a predetermined threshold wherein means responsive to said intermediate signal comprises a second Josephson junction device that switches from a zero voltage state to a non-zero voltage state when said instantaneous value of said intermediate signal exceeds said predetermined threshold.

5. The generator of claim 4 wherein said means for converting comprises a transmission line having a first end that receives said first signal and a second end that is terminated so as to produce a reflection of a signal that enter said transmission line at said first end said.

6. An incremental time delay generator in a Time Domain Reflectometer for producing an output signal data variable time delay in response to a trigger signal comprising:
    means for generating a first signal in response to said trigger signal;
    means for converting said first signal into an intermediate signal having an instantaneous value that varies at each of one or more fixed time intervals wherein said means for converting comprises:
      a first superconducting strip line for passing signals therethrough, having a first end that receives said first signal and a second end terminated so as to produce a reflection of a signal that enters said first end, said first superconducting strip line being arranged so as to have a plurality of inductive taps; and
      a second superconducting strip line inductively coupled with said plurality of inductive taps, said second superconducting strip line producing said intermediate signal in response to signals passing through said first superconducting strip line; and
    means responsive to said intermediate signal for producing said output signal at a time delay determined by when said instantaneous value of said intermediate signal exceeds a predetermined threshold.

7. An incremental time delay generator disposed on a substrate for producing an output signal at a variable time delay in response to a trigger signal, comprising:
  a first superconducting device for generating a first pulse signal in response to said trigger signal;
  means for converting said first pulse signal into a step signal wherein a time interval T is defined as the time between successive steps of said step signal; and
  a second superconducting device responsive to said step signal for producing a second pulse signal when said step signal exceeds a predetermined threshold where the time delay generated by said generator is equal to nT when said step signal exceeds said predetermined threshold in the (n+1)th step of said step signal.

8. The generator of claim 7 wherein said means for converting comprises a transmission line having a first end that receives said first pulse signal and a second end that is terminated so as to produce a reflection of a signal that enters said transmission line at said first end said.

9. The generator of claim 7 wherein said means for converting comprises:
  a first superconducting strip line for passing signals therethrough, having a first end that receives said first signal and a second end terminated so as to produce a reflection of a signal that enters said first end, said first superconducting strip line being arranged so as to have a plurality of inductive taps; and
  a second superconducting strip line inductively coupled with said plurality of inductive taps, said second superconducting strip line producing said step signal in response to signals passing through said first superconducting strip line.

10. An incremental time delay generator responsive to a trigger signal for producing an output signal at a first time after receiving said trigger signal, said first time being variable, comprising:
  first Josephson junction means for generating a pulse signal in response to said trigger signal;
  means for converting said pulse signal into an intermediate signal, said intermediate signal having an instantaneous value that varies by a fixed value at each of one or more fixed time intervals T; and
  second Josephson junction means responsive to said intermediate signal for producing said output signal when said intermediate signal exceeds a predetermined threshold, such that the number of fixed time intervals that have elapsed before said intermediate signal exceeds said predetermined threshold determines said first time.

11. The generator of claim 10 wherein said means for converting comprises a transmission line having a first end that receives said pulse signal from said first Josephson junction means and a second end that is terminated so as to produce a reflection of a signal that enters said transmission line at said first end, said step signal being produced outside said first end of said transmission line.

12. The generator of claim 10 wherein said means for converting comprises:
  a first superconducting strip line having a plurality of inductive taps for passing a signal therethrough, and having a first end for receiving said pulse signal and a second end at which a reflection of a signal entering through said first end is produced; and
  a second superconducting strip line inductively coupled to said first superconducting strip line at said plurality of inductive taps for producing said intermediate signal by summing said pulse signal and any reflection signal traversing said first superconducting strip line as the pulse signal or reflection signal passes through each inductive tap.

13. The generator of claim 12 wherein the time necessary for a signal to travel said first superconducting strip line from a first inductive tap to a second inductive tap immediately following said first inductive tap o said first superconducting strip line is T.

14. The generator of claim 10 wherein said predetermined threshold is variable in accordance with a bias current that is applied to said second Josephson junction means.

* * * * *

UNITED STATES PATENT AND TRADEMARK OFFICE
CERTIFICATE OF CORRECTION

PATENT NO. : 4,812,689

DATED : March 14, 1989

INVENTOR(S) : Whiteley, Steve

It is certified that error appears in the above-identified patent and that said Letters Patent is hereby corrected as shown below:

Column 4, line 62, "output" should read --output signal--.

Column 6, line 15, "FIG. 2(b)." should read --FIG. 1--.

Column 9, line 18, "signals however the" should read --signals. However, the--.

Column 10, line 17, "signals" should read --signal--.

Column 10, line 18, "as" should read --a--.

Column 10, line 43, "end said." should read --end.--.

Column 10, line 46, "data" should read --at a--.

Column 11, lines 24 and 25, "end said" should read --end.--.

Column 12, line 38, "o" should read --on--.

Signed and Sealed this

Second Day of April, 1991

Attest:

HARRY F. MANBECK, JR.

*Attesting Officer*         *Commissioner of Patents and Trademarks*